United States Patent [19]

Uchiyama et al.

[11] Patent Number: 4,779,228
[45] Date of Patent: Oct. 18, 1988

[54] SEQUENTIAL-ACCESS MEMORY

[75] Inventors: Yasuji Uchiyama; Shigeki Yamamoto, both of Hamamatsu, Japan

[73] Assignee: Nippon Gakki Seizo Kabushiki Kaisha, Japan

[21] Appl. No.: 945,789

[22] Filed: Dec. 23, 1986

[30] Foreign Application Priority Data

Dec. 28, 1985 [JP] Japan .................................. 60-299414

[51] Int. Cl.⁴ ......................... G11C 11/40; G11C 13/00
[52] U.S. Cl. ...................................... 365/76; 365/210; 365/222
[58] Field of Search .................... 365/73, 75, 76, 210, 365/222

[56] References Cited

U.S. PATENT DOCUMENTS 3,555,521  1/1971  Mears .................... 365/75

Primary Examiner—Terrell W. Fears
Attorney, Agent, or Firm—Darby & Darby

[57] ABSTRACT

A sequential-access memory of an auto-refreshing type has an increased storage capacity. The sequential-access memory has at least two dynamic-type memory cell arrays serially connected to one another to form a loop. Each array comprises N rows by M columns of memory cells each having a read selection line and a write selection line. The read selection line of each memory cell of each row is connected to the write selection line of the memory cell of the same row which comes next to the each memory cell to form an address selection line. The address selection lines of each memory cell array are activated one after another to effect a sequential access to the memory cell array. Data read form each memory cell array is fed through a delay circuit to the memory cell array which comes next to the each memory cell array. A logic circuit for subjecting data outputted from one memory array may be additionally provided to feed data representative of the result of the predetermined operation to the next memory array.

4 Claims, 7 Drawing Sheets

FIG. 7

SEQUENTIAL-ACCESS MEMORY

BACKGROUND OF THE INVENTION

1. Field of the Invention

This invention relates to a memory of a sequential access type and more particularly to such a sequential-access memory which is automatically refreshed and has an increased memory capacity.

2. Related Art

There have been proposed various kinds of sequential-access memories of dynamic types which are, in general, suitable for storing musical data such as tone pitch data and tone color data for electronic musical instruments.

One of the inventors of the present application has proposed a sequential-access memory of such kind in Japanese Patent Application No. 58-214898 which was laid-open under No. 60-107795. FIG. 1 shows the structure of the sequential-access memory 10 which is arrange to store "n" pieces of bits. (Four memories 10 connected in parallel are shown in FIG. 1.) In FIG. 1, shown at $11_1$ to $11_n$ are a row of conventional three-transistor type dynamic RAM storage cells each of which comprises three transistors T3 to T5 and a capacitor C. The transistor T4 cooperates with the capacitor C to form an information storage element. More specifically, the transistor T4 conducts when the capacitor C is charged, and is off when the capacitor C is discharged. When a gate of the transistor T5 of the cell $11_i$ ("i" is any one of "1" to "n"), that is, a read selection line $R_i$ of the cell $11_i$, is supplied with a selection signal $S_i$ of "1", the transistor T5 of the cell $11_i$ conducts to connect the transistor T4 of the cell $11_i$ to a read data line 12. The read selection line $R_i$ of the cell $11_i$ is connected to a gate of the transistor T3 of the preceding stage cell $11_{i-1}$, that is, a write selection line $W_{i-1}$ of the preceding stage cell $11_{i-1}$. When a gate of the transistor T3 of the cell $11_i$, that is, a write selection line $W_i$ of the cell $i$, is supplied with a selection signal $S_{i+1}$ of "1", the transistor T3 of the cell $11_i$ conducts to connect a data write line 13 to the capacitor C of the cell $11_i$, whereby the capacitor C is charged or discharged in accordance with a signal on the data write line 13. The write selection line $W_i$ of the cell $11_i$ is connected to the read selection line $R_{i+1}$ of the succeeding stage cell $11_{i+1}$.

Thus, the dynamic storage cells $11_1$ to $11_n$ are serially connected in such a manner that the read selection line $R_i$ of the cell $11_i$ is connected to the write selection line $W_{i-1}$ of the preceding stage cell $11_{i-1}$. All the cells $11_1$ to $11_n$ are connected to the common read data line 12 and to the common write data line 13. The memory 10 is driven by a pair of clock signals $\phi 1$ and $\phi 2$ 180° out of phase from each other (see FIGS. 2-(a) and 2-(b)), each clock having a period of T. The selection signals $S_1$ to $S_n$ are rendered "1" one after another in synchronism with the clock signal $\phi 2$ to achieve a sequential access to the cells $11_1$ to $11_n$, as shown in FIG. 2.

In operation, when the selection signal $S_1$ (FIG. 2-(d)) is rendered "1" to access the storage cell $11_1$, the data contained in the cell $11_1$ is outputted onto the read data line 12 as read data $DR_1$ and stored into a latch 14 by the clock signal $\phi 2$ (FIG. 2-(b)). The data $DR_1$ thus read from the cell $11_1$ and stored in the latch 14 is inverted by an inverter 15 and outputted from this memory 10 as an output data OUT1 (FIG. 2-(h)). If a write pulse signal W (FIG. 2-(k)) is at the "0" level at this time, the output data OUT1 is also fed through a selector 16 to a delay circuit 17 and stored thereinto by the clock signal $\phi 1$ (FIG. 2-(a)). The data OUT1 (or the data $DR_1$) thus stored into the delay circuit 17 is outputted therefrom onto the write data line 13 by the next clock $\phi 2$. The next selection signal $S_2$ is rendered "1" simultaneously with this clock signal $\phi 2$, so that the data outputted onto the write data line 13, which is the same data as the data $DR_1$ read from the cell $11_1$, is written into the same cell $11_1$, thereby the cell $11_1$ being refreshed. If the write pulse signal W is at the "1" level, write data $DW_1$ (FIG. 2-(j)) from the exterior passes through the selector 16 and is stored into the delay circuit 17, so that the new data $DW_1$ is written into the cell $11_1$. The data on the write data line 13 is also outputted from this memory 10 as data OUT2 (FIG. 2-(i)). The operation is true of the cells $11_2$ to $11_n$. The read data line 12 is pre-charged immediately before each reading operation through a transistor 18 which is conducted by a pre-charge control pulse signal PC (FIG. 2-(c)) generated in synchronization with the clock signal $\phi 1$.

With the above arrangement, all the memory cells $11_1$ to $11_n$ of the memory 10 are sequentially accessed and are therefore automatically refreshed. In addition, the memory 10 has a function to delay each data by a time period corresponding to "n" cycles of the clock signal $\phi 1$, $\phi 2$. However, the memory 10 is not satisfactory in the following respects:

When the number "n" of storage cells is augmented to increase the storage capacity, the access time for each cell is also increased, so that the refreshing rate is decreased, which may result in an insufficient refreshing of each storage cell.

Moreover, in order to test the memory 10, it is necessary to apply the selection signals $S_1$ to $S_n$ to the memory 10 one by one and to compare the inputted data with the outputted data for each selection signal.

SUMMARY OF THE INVENTION

It is therefore an object of the present invention to provide a sequential-access memory which can have an increased storage capacity without decreasing the refreshing rate, thereby enabling the memory to be refreshed without fail.

It is another object of the invention to provide a sequential-access memory which can be tested in a simple manner.

According to an aspect of the present invention, there is provided a sequential-access memory comprising at least two memory cell arrays each of which comprises a plurality of dynamic-type memory cells each having a write selection line, a read selection line, a data output line and a data input line, the plurality of memory cells being arranged to form a row of memory cells in such a manner that the read selection line of each memory cell is connected to the write selection line of the memory cell which comes next to the each memory cell to form an address selection line, the data output lines of the plurality of memory cells being connected together to form a read data line, the data input lines of the plurality of memory cells being connected together to form a data write line; access control means for activating the address selection lines of each of the at least two memory cell arrays one after another at a predetermined time interval; and delay circuit means interposed between each adjoining pair of memory cell arrays among the at least two memory cell arrays to connect the at least two memory arrays in series in such a manner that data on the read data line of each memory cell array is delayed by a predetermined time interval and fed to the write data line of the memory cell array which comes next to the each memory cell array.

BRIEF DESCRIPTION OF THE DRAWINGS

FIG. 7 is a timing chart showing the sequence of selection of the memory cells $SC_1$ to $SC_{45}$ of the memory cell arrays 51 and 52.

DESCRIPTION OF THE PREFERRED EMBODIMENTS OF THE INVENTION

The present invention will now be described with reference to the accompanying drawings.

Figure 3:
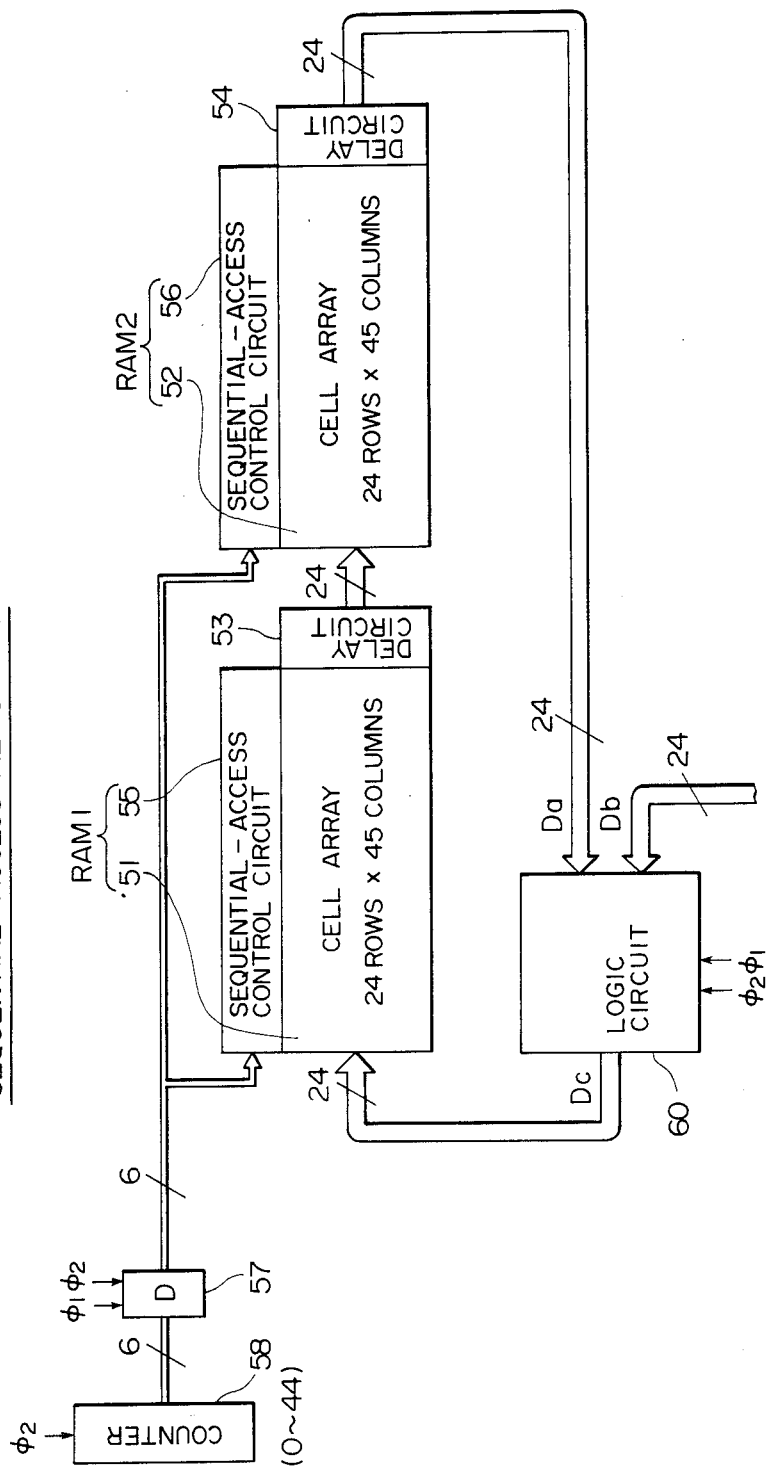
FIG. 3 is a block diagram of a sequential-access memory 50 provided in accordance with one embodiment of the present invention.

Referring now to FIG. 3, there is shown a sequential-access memory 50 provided in accordance with one embodiment of the present invention which includes two storage sections RAM1 and RAM2 serially connected to each other. This sequentialaccess memory 50 is operated in accordance with a pair of clock signals $\phi 1$ and $\phi 2$ which are 180° out of phase from each other. The storage sections RAM and RAM2 comprise dynamic storage cell arrays 51 and 52, respectively, each of which includes 24 rows by 45 columns dynamic storage cells. In this case, each column of cells store one word of data which is composed of 24 bits, and each row of cells are composed, as shown in FIG. 4, of 45 dynamic storage cells $SC_1$ to $SC_{45}$ which are serially connected in a manner described above for the memory 10 of FIG. 1.

Figure 1:
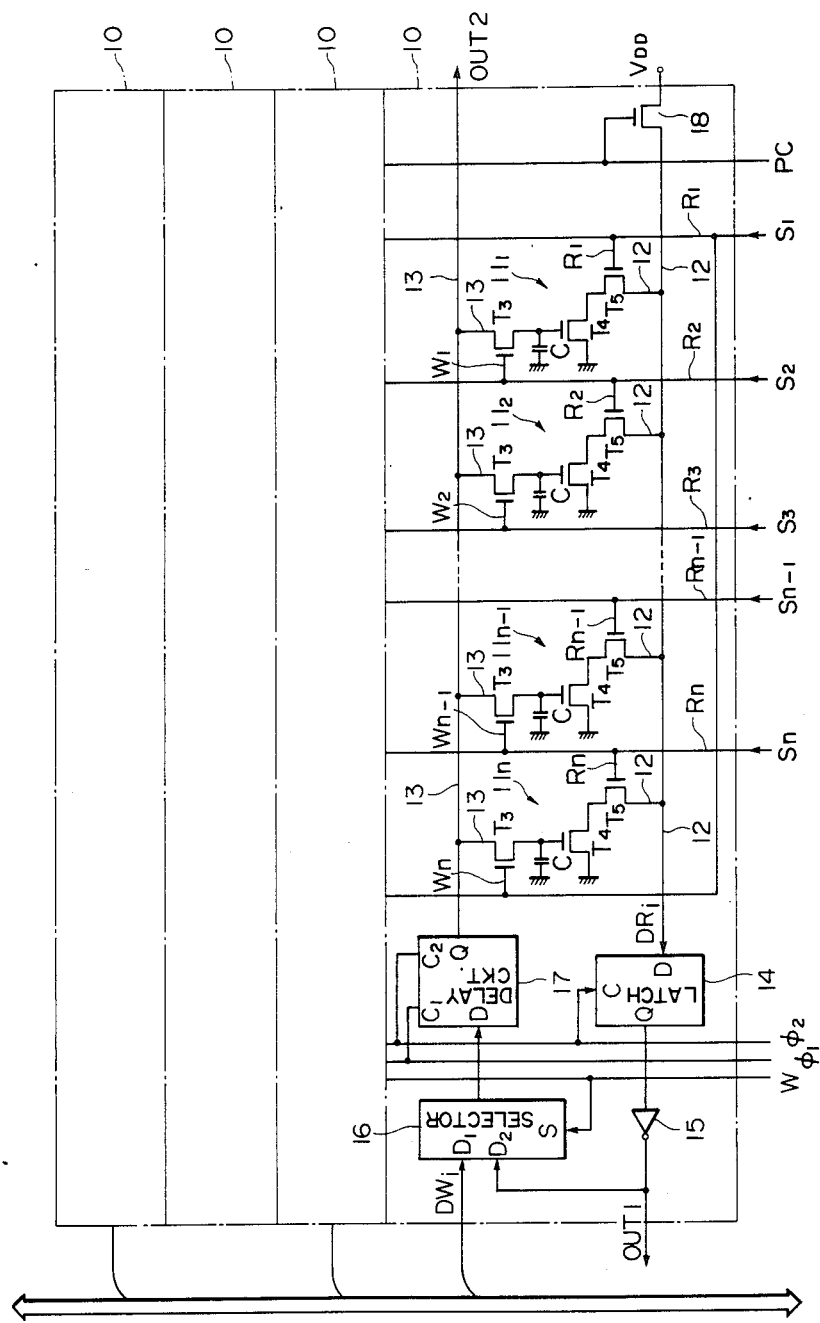
FIG. 1 is a block diagram of a sequential-access memory of prior art.
Figure 5:
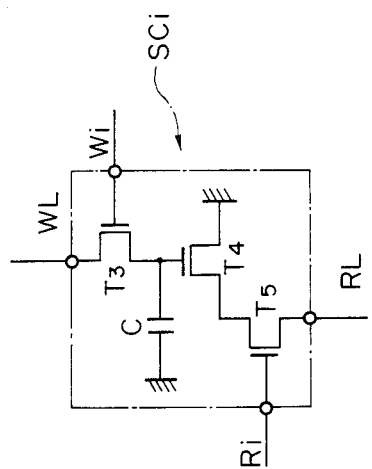
FIG. 5 is a circuit diagram of one of the memory cells $SC_1$ to $SC_{45}$ of the memory cell arrays 51 and 52 of FIG. 4.

As shown in FIG. 5, each cell $SC_i$ ("i" is any one of "1" to "45") is composed of a conventional three-transistor type dynamic RAM storage cell which comprises, similarly to the cell $11_i$ of FIG. 1, three transistors T3 to T5 and a capacitor C. The transistor T4 cooperates with the capacitor C to form a memory element, wherein the electric charge of the capacitor C determines the ON-/OFF state of the transistor T4. The transistor T5 of the cell $SC_i$ is brought into the ON state to connect the transistor T4 to a read data line RL when a "1" signal is applied to a read selection line $R_i$ which is connected to a gate of the transistor T5. On the other hand, the transistor T3 is brought into the ON state to connect a write data line WL to the capacitor C (or a gate of the transistor T4), when a "1" signal is applied to a write selection line $W_i$ which is connected to a gate of the transistor T3.

Figure 2:
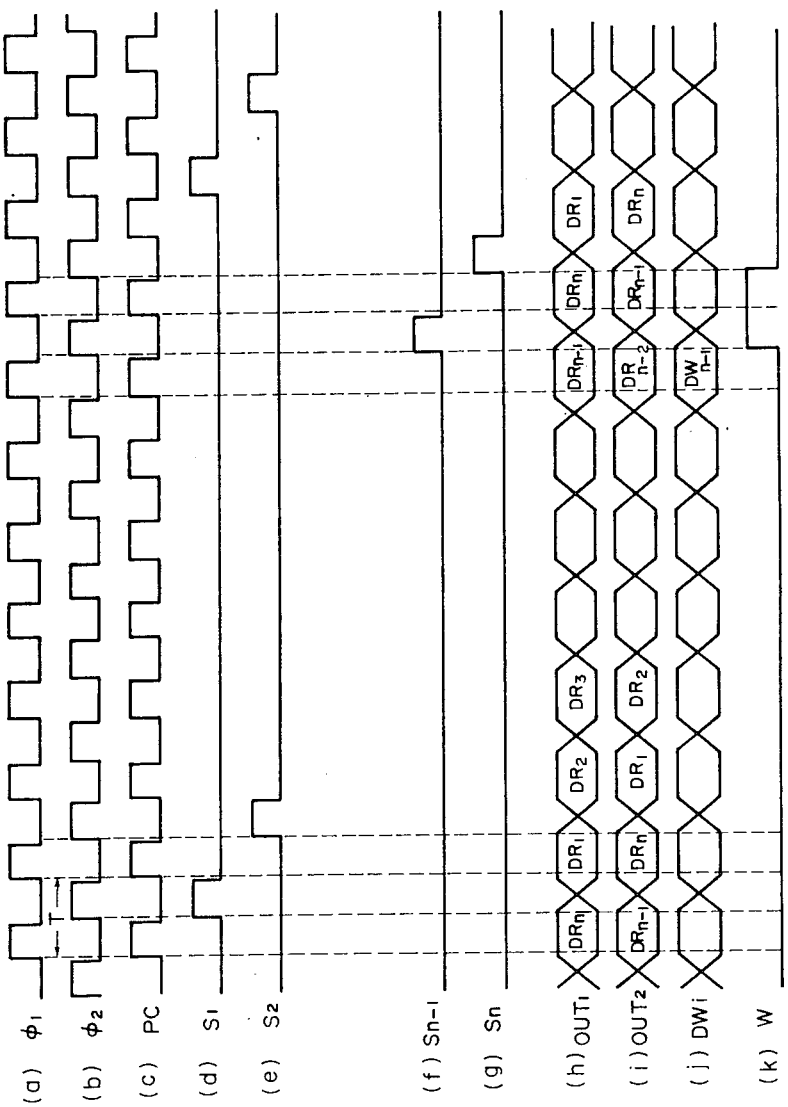
FIG. 2 is a time chart of various signals of the sequential-access memory of FIG. 1.
Figure 4:
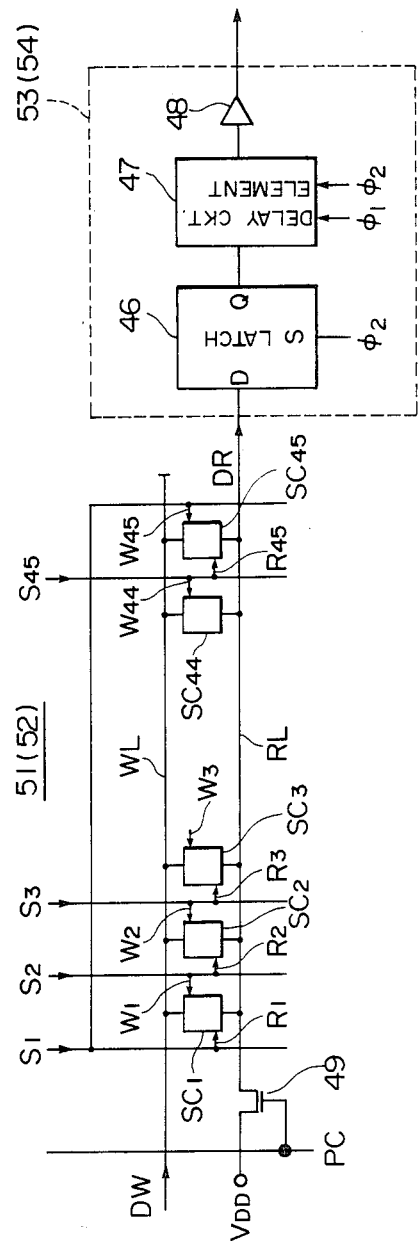
FIG. 4 is a circuit diagram of a part of the memory 50 of FIG. 3.

The cells $SC_1$ to $SC_{45}$ of each row are connected, as shown in FIG. 4, such that the write selection line $W_i$ of the cell $SC_i$ is connected to the read selection line $R_{i+1}$ of the succeeding stage cell $SC_{i+1}$. The read selection lines $R_1$ to $R_{45}$ are supplied respectively with selection signals $S_1$ to $S_{45}$. More specifically, a junction point of the write selection line $W_1$ of the cell $SC_1$ and the read selection line $R_2$ of the cell $SC_2$ is supplied with the selection signal $S_2$, a junction point of the write selection line $W_2$ of the cell $SC_2$ and the read selection line $R_3$ of the cell $SC_3$ is supplied with the selection signal $S_3$, and so on. A junction point of the write selection line $W_{45}$ of the cell $SC_{45}$ and the read selection line $R_1$ of the cell $SC_1$ is supplied with the selection signal $S_1$. All the transistors T3 of the cells $SC_1$ to $SC_{45}$ are connected to the write data line WL, and all the transistors T5 of the cells $SC_1$ to $SC_{45}$ are connected to the read data line RL. The selection signals $S_1$ to $S_{45}$ are rendered "1" one after another in synchronization with the clock $\phi 2$, in a manner described above for the memory 10 of FIG. 1 (see FIG. 2), to sequentially access the cells $SC_1$ to $SC_{45}$.

With this arrangement, when the selection signals $S_1$ to $S_{45}$ are rendered "1" one after another, data are sequentially read from the cells $SC_1$ to $SC_{45}$ and outputted onto the read data line RL as read data DR. In parallel with this, write data DW on the write data line WL are sequentially written into the cells $SC_{45}$ and the cells $SC_1$ to $SC_{44}$. The above operation is repeatedly carried out.

Each data DR outputted onto the read data line RL is supplied to a latch 46 provided in a delay circuit 53 and stored thereinto by the clock signal $\phi 2$ which is generated simultaneously with the selection signal S by which the data DR was read. The data DR thus held by the latch 46 is then stored into a delay circuit element 47 by the clock signal $\phi 1$ which is generated immediately after the clock signal $\phi 2$ which caused the data DR to be stored in the latch 46. This data DR is outputted from the delay circuit element 47 by the clock signal $\phi 2$ which comes next to the clock signal $\phi 1$ which caused the data DR to be stored in this delay circuit element 47. Thus, the delay circuit element 47 delays the data DR by a time period T equal to one cycle of the clock signal $\phi 2$, that is, a time interval at which the selection signals S are generated. The data outputted from the delay circuit element 47 is outputted through an amplifier 48.

The read data line RL of the row of cells $SC_1$ to $SC_{45}$ is connected to a transistor 49 which conducts to precharge the read data line RL in response to a pre-charge control pulse signal PC applied to a gate of the transistor 49. The precharge control pulse signal PC is generated in synchronization with the clock signal $\phi 1$ (see FIG. 2).

The left-hand side circuit portion of FIG. 4 which includes the cells $SC_1$ to $SC_{45}$ and the transistor 49 constitute one of the first to 24th rows of cells of the cell array 51 (or cell array 52) shown in FIG. 3, and the righthand side circuit portion of FIG. 4 which includes the latch 46, the delay circuit element 47 and the amplifier 48 constitute one of 24 circuit portions of the delay circuit 53 (or 54) which are provided correspondingly to the first to 24th rows of cells of the cell array 51 (or 52). Thus, the number of read data lines RL, which connect the cell array 51 to the delay circuit 53 (or the cell array 52 to the delay circuit 54) is 24. The first to 24th read data lines RL of the cell array 51 are connected through the corresponding circuit portions of the delay circuit 53 to the first to 24th write data lines WL of the cell array 52, respectively, as shown in FIG. 3.

The cell arrays 51 and 52 are provided respectively with sequential-access control circuits 55 and 56 each of which causes the selection signals $S_1$ to $S_{45}$ to become "1" one after another in accordance with 6-bit output of a delay circuit 57. The delay circuit 57 is arranged to delay a 6-bit count output of a modulo-45 counter 58 by the time period T equal to one cycle of the clock signal $\phi2$ (or clock signal $\phi1$). The counter 58 counts the pulses of the clock signal $\phi2$ to output the 6-bit count output which is stored into the delay circuit 57 by the next clock $\phi1$. The count output of the counter 58 stored in the delay circuit 57 is outputted therefrom by the next clock signal $\phi2$. Thus, as the counter outputs "0", "1", "2", "3", "4"... "43", "44", "0", "1"... as its count output, each of the sequential-access control circuits 55 and 56 renders the selection signals $S_1$, $S_2$, $S_3$, $S_4$, $S_5$, ... $S_{44}$, $S_{45}$, $S_1$, $S_2$... "1" one after another. The sequential-access control circuit 55 (56) may comprise a decoder and and a shift register, and the structure thereof is within the skill of one of ordinary skill in the art.

Thus, the storage section RAM1, which comprises the cell array 51 having 24 rows by 45 columns of cells and the sequential-access control circuit 55, is serially connected through the delay circuit 53 to the storage section RAM2 which comprises the cell array 52 having 25 rows by 45 columns of cells and the sequential-access control circuit 56. Both of the storage sections RAM1 and RAM2 thus connected in series are simultaneously accessed by the sequential-access control circuits 55 and 56.

The 24-bit read data DR on the first to 24th read data lines RL of the cell array 52 are delayed by the delay circuit 54 by the time period T equal to one cycle of the clock signal $\phi2$ (or $\phi1$), and supplied as 24-bit data Da to a first data input terminal of a logic circuit 60. The logic circuit 60 subjects the 24-bit data Da fed from the delay circuit 54 and 24-bit data Db fed from an exterior circuit (not shown) to a predetermined operation, and outputs the operation result as data Dc.

The structure of the logic circuit 60 will now be more fully described with reference to FIG. 6

Figure 6:
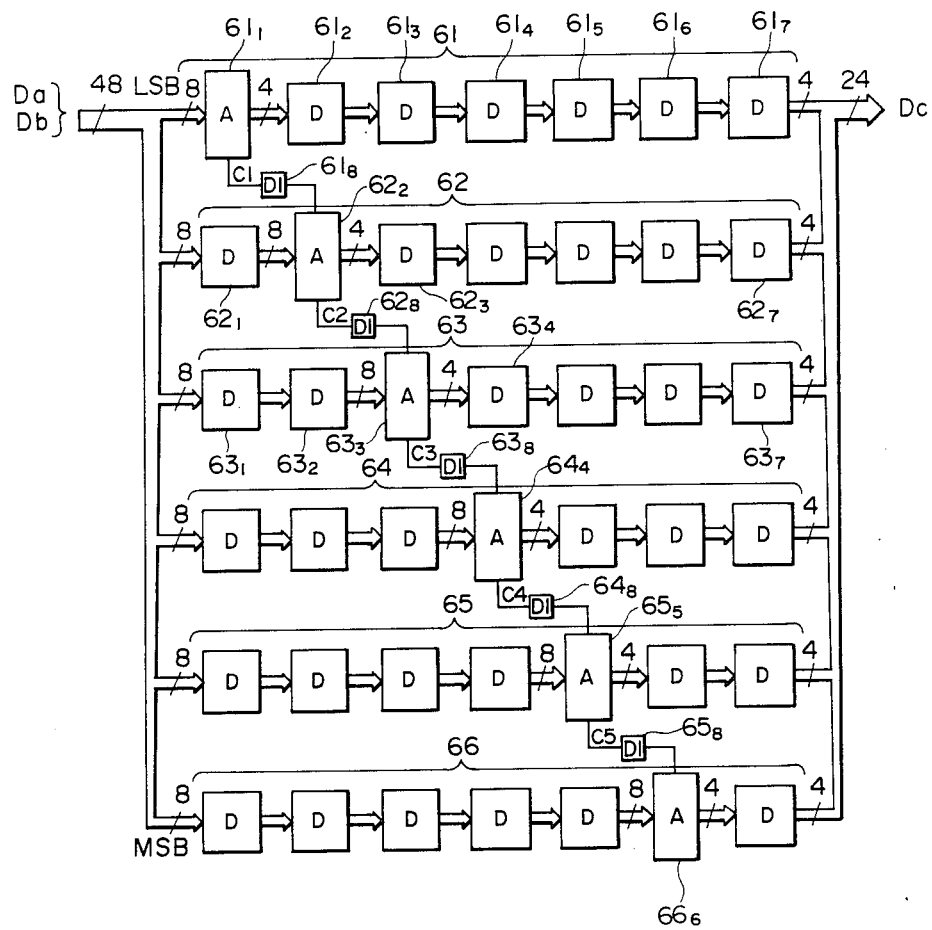
FIG. 6 is a detailed block diagram of the logic circuit 60 of the memory 50 of FIG. 3.

In FIG. 6, each of the data Da and Db is divided into six series of 4-bit data to effect the predetermined operation (an addition operation in this case) on the pair of data of each series. More specifically, the lowest-order four bits of each of the data Da and Db are supplied to the first series operation circuit 61, the second lowest-order four bits of each of the data Da and Db are supplied to the second series operation circuit 62, ... and the highest-order four bits of each of the data Da and Db are supplied to the sixth series opertion circuit 66.

The first series operation circuit 61 comprises a four-bit full adder $61_1$ for adding the lowest-order four bits of the data Da and Db together, and serially connected six delay circuits $61_2$ to $61_7$ each responsive to the clock signals $\phi2$ and $\phi1$ for delaying four-bit data inputted thereto by the time period T corresponding to one cycle of the clock signal $\phi2$ (or $\phi1$). Since the adder $61_1$ is disposed foremost of all, the four-bit addition result outputted from the adder $61_1$ is delayed by a time period equal to 6T and supplied to input terminals of the storage section RAM1, that is to say, to the first to fourth write data lines WL of the cell array 51. A carry output c1 of the adder $61_1$ is supplied to a delay circuit $61_8$ which delays this carry c1 in response to the clock signals $\phi2$ and $\phi1$ by the time period T equal to one cycle of the clock signal $\phi2$ (or $\phi1$), and supplies the delayed carry c1 to the second series operation circuit 62.

The second series operation circuit 62 comprises a eightbit delay circuit $62_1$ for delaying the second lowest-order four bits of each of the data Da and Db by the time period equal to T, a full adder $62_2$ for adding the two four-bit data outputted from the delay circuit $62_1$ and the delayed carry c1 together, and serially connected five delay circuits $62_3$ to $62_7$ eaoh for delaying a four-bit input data by the time period equal to T. Thus, the second lowest-order four bits of the data Da and Db are first delayed by the time period T and then added together with the delayed carry c1 from the first series operation circuit 61. The four-bit addition result is subsequently delayed by a time period equal to 5T and supplied to the fifth to eighth write data lines WL of the cell array 51. A carry output c2 of the adder $62_2$ is delayed by the time period equal to T by a delay circuit $62_8$ and supplied to the third series operation circuit 63.

The third series operation circuit 63 comprises two eight-bit delay circuits $63_1$ and $63_2$ for delaying the third lowest-order four bits of each of the data Da and Db by a time period equal to 2T, a full adder $63_3$ for adding the two four-bit data outputted from the delay circuit $63_2$ and the delayed carry c2 together, and serially connected four delay circuits $63_4$ to $63_7$ each for delaying a four-bit input data by the time period equal to T. Thus, the third lowest-order four bits of the data Da and Db are first delayed by the time period 2T and then added together with the delayed carry c2 from the second series operation circuit 62. The four-bit addition result is subsequently delayed by a time period equal to 4T and supplied to the ninth to twelfth write data lines WL of the cell array 51. A carry output c3 of the adder $63_3$ is delayed by the time period equal to T by a delay circuit $63_8$ and supplied to the fourth series operation circuit 64.

Similarly, the fourth, fifth and sixth series operation circuits 64, 65 and 66 have three, four and five delay circuits upstream of their full adders $64_4$, $65_5$ and $66_6$, respectively, so that addition operations are effected in the circuits 64, 65 and 66 at timings the time period T shifted from each other. The addition results outputted from the adders $64_4$, $65_5$ and $66_6$ are delayed, before being outputted from this logic circuit 60, respectively by three delay circuits, two delay circuits and one delay circuit each for delaying its input data by the time period equal to T. A carry output c4 of the adder $64_4$ is supplied to the adder $65_5$ through a delay circuit $64_8$, and a carry output c5 of the adder $65_5$ is supplied through a delay circuit $65_8$ to the adder $66_6$.

With this logic circuit 60, one of the pairs of four-bit portions of the data Da and Db are added together within one clock period T, so that all the 24 bits of the data Da and those of the data Db are added together within six clock periods 6T. In this case, since each full adder is of four-bit type, the addition of the two data Da and Db is performed at a high speed.

Thus, the 24-bit data Da outputted from the delay circuit 54 (FIG. 3) is added to the 24-bit data Db fed from the external circuit, and the 24-bit data Dc obtained as a result of the addition is supplied to the first to 24th write data lines WL of the cell array 51 six clock periods 6T later.

The operation of the memory 50 will no be described with reference to FIGS. 7 and 8.

Figure 7:
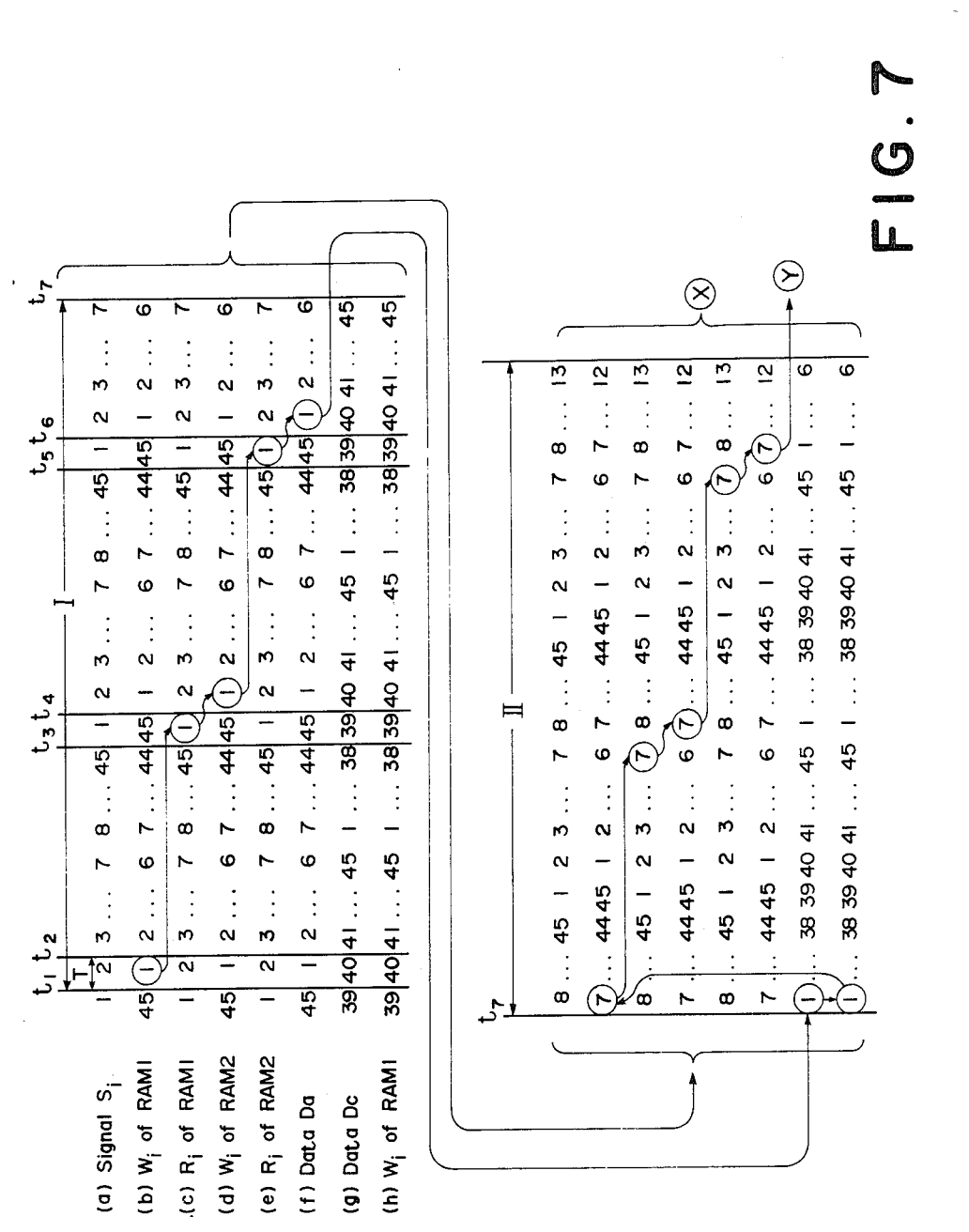
Figure 8:
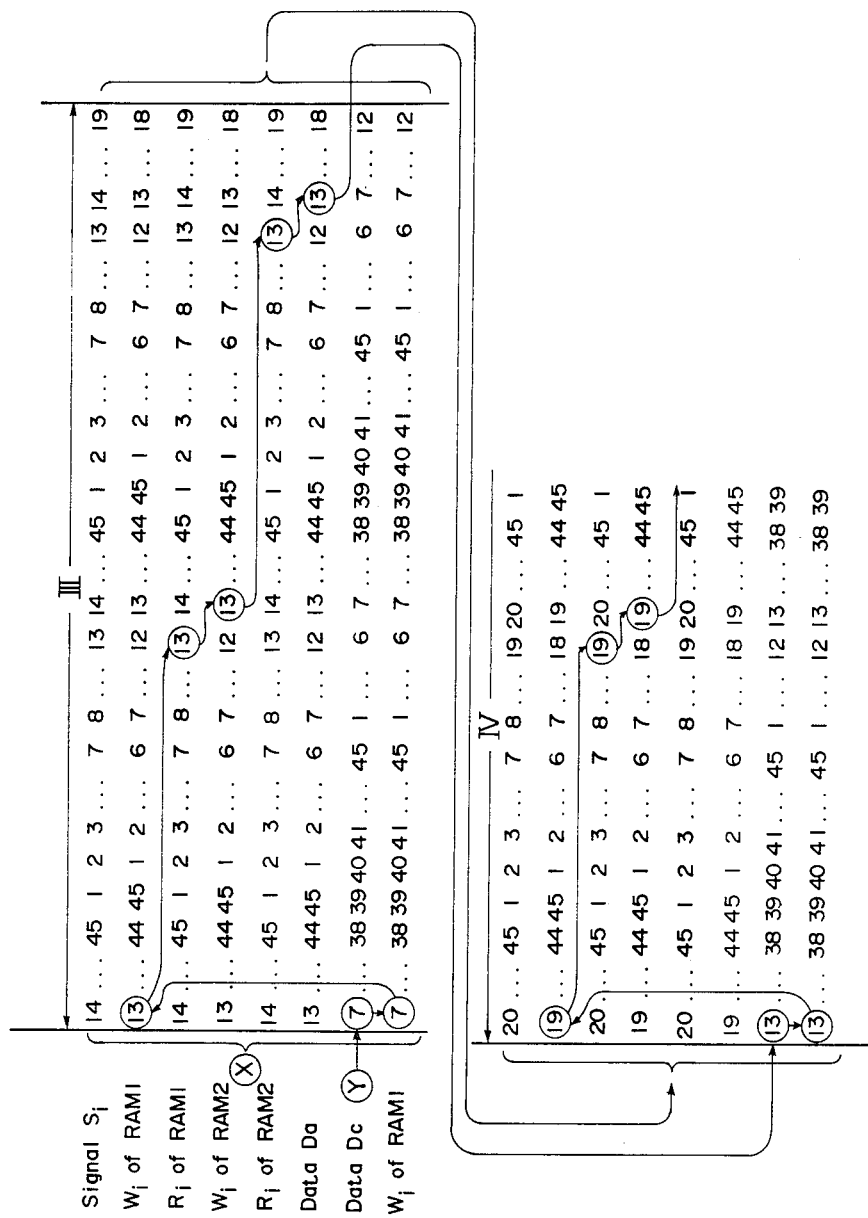
FIG. 8 is the continuation of the timing chart of FIG. 7.

FIGS. 7 and 8 are time charts wherein the horizontal axes represent time and wherein the numbers of the cells simultaneously accessed by each selection signal S are indicated along the vertical axes. For example, at time $t_1$ of FIG. 7, the selection signals $S_2$ of "1" are applied to the write selection lines $W_1$ and the read selection lines $R_2$ of the storage section RAM1 and to the write selection lines $W_1$ and the read selection lines $R_2$ of the storage section RAM2. As a result, data are written respectively into the first cells $SC_1$ of the storage sections RAM1 and RAM2, and at the same time data are read respectively from the second cells $SC_2$ of the storage sections RAM1 and RAM2. Each of FIGS. 7 and 8 is divided into upper and lower parts, wherein the lower part is the continuation of the upper part. Also, the upper part of FIG. 8 is the continuation of the lower part of FIG. 7.

At time $t_2$ of FIG. 7, which is one clock period T after the time $t_1$, the selection signals $S_3$ are rendered "1", and as a result, data are written into the second cells $SC_2$ of the storage sections RAM1 and RAM2, and at the same time data are read from the third cells $SC_3$ of the storage sections RAM1 and RAM2. In this manner, the selection signals $S_1$ to $S_{45}$ are rendered "1" one after another at a time interval equal to one clock period T, so that a round of accesses to all the memory cells of each of the storage sections RAM1 and RAM2 are performed within 45 clock periods 45T.

Data written into the first cells $SC_1$ of the storage section RAM1 by the selection signal $S_2$ at the time $t_1$ is read from the same cells $SC_1$ by the selection signal $S_1$ forty four (44) clock periods later, that is, at time $t_3$ ($=t_1+44T$). The data thus read from the cells $SC_1$ at the time $t_3$ is held by the latches 46 of the delay circuit 53 and written, by the selection signal $S_2$, into the first cells $SC_1$ of the storage section RAM2 through the delay circuit elements 47 forty five (45) clock periods after the time $t_1$, that is, at time $t_4$ ($=t_1+45T$).

The data written into the first cells $SC_1$ of the storage section RAM2 at the time $t_4$ is read from the same cells $SC_1$ forty four clock periods later, that is, at time $t_5$ ($=t+44T$). The data thus read from the cells $SC_1$ at the time $t_5$ is held by the latches 46 of the delay circuit 54 and supplied through the delay circuit elements 47 to the input terminal of the logic circuit 60 as the data Da forty five (45) clock periods after the time $t_4$, that is, at time $t_6$ ($=t_4+45T$).

The foregoing is the process of the data written into the first cells $SC_1$ of the storage section RAM1. The same is true of each of data written into other cells. More specifically, data written into each column of cells (i. e., the cells $SC_1$, the cells $SC_2$, ... or the cells $SC_{45}$) of the storage section RAM1 is outputted from the storage section RAM2 ninety clock periods (90T) later and supplied to the input terminal of the logic circuit 60. In other words, the sequential-access memory 50 comprising the storage sections RAM1 and RAM2 serves as a delay circuit having a delay time equal to ninety clock periods.

The data Da supplied to the logic circuit 60 at the time $t_6$ is added to the data Db fed to the logic circuit 60 at that time from the external circuit, and outputted from the logic circuit 60 as the data Dc six clock periods later, that is, at time $t_7$. The data Dc thus outputted from the logic circuit 60 at the time $t_7$ is written into the seventh cells $SC_7$ of the ( storage section RAM1 (see FIGS. 7-(b), 7-(g) and 7-(h)). More specifically, each of the data Da and Db is divided into the six series of four-bit data in the logic circuit 60, and the pairs of series of four-bit data are added together in sequence from the pair corresponding to the lowest-order four bits of the data Da and Db. The results of these additions in the form of 24-bit data (or the data Dc) are simultaneously outputted from the logic circuit 60 six clock periods later, and written into the seventh cells $SC_7$ (24 bits) of the storage section RAM1.

Thus, the data read from the first cells $SC_1$ of the storage section RAM1 at the time $t_1$ reaches the seventh cells $SC_7$ of the same storage section RAM1 ninety six (96) clock periods after the time $t_1$, that is at the time $t_7$. In this case, the data Da is added to the data Db while being delayed.

Thus, each of the storage sections RAM1 and RAM2 operates in a cycle corresponding to 45 clock periods, but the memory 50 operates as a whole (inclusively of the logic circuit 60) in a cycle corresponding to 96 clock periods. Therefore, the data written into the first cells $SC_1$ of the storage section RAM1 at the time $t_1$ in the first phase I shown in FIG. 7 is inputted to the logic circuit 60 at the time $t_6$ which is 90 clock periods after the time $t_1$. After making a full round in the entire circuit of the memory 50, the data is written into the seventh cells $SC_7$ of the storage section RAM1 96 clock periods after the time $t_1$, that is, at the time $t_7$ in the beginning of the second phase II shown in FIG. 7. After making the second round in the entire circuit of the memory 50, the same data is written into the thirteenth cells $SC_{13}$ of the storage section RAM1 90 clock periods after the time $t_7$ in the third phase III shown in FIG. 8. After the third round, that is, 288 clock periods later, the data is stored in the nineteenth cells $SC_{19}$ of the storage section RAM1. The data is thereafter written into the 25th cells $SC_{25}$, 31st cells $SC_{31}$, the 37th cells $SC_{37}$, and so on. Thus, each time a round of the data in the circuit is made, the data is stored in those cells of the storage section RAM1 which are disposed six cells downstream of the cells into which the same data was precedingly written.

Thus, with the arrangement of the memory 50, an access to the cells is independently performed in each of the storage sections RAM1 and RAM2. In each of the storage sections RAM1 and RAM2, accesses to all the columns of cells are performed every 45 clock periods, so that the storage capacity of the memory can be increased two times larger than the memory 10 of FIG. 1 with the refreshing cycle of each cell being kept at 45 clock periods.

In the case of the data Db being "0", data composed of 24 "1" bits written into the first cells $SC_1$ of t section RAM1 is transferred in sequence from the first cells $SC_1$ to the seventh cells $SC_7$, from the seventh cells $SC_7$ to the thirteenth cells $SC_{13}$, from the thirteenth cells $SC_{13}$ to the nineteenth cells $SC_{19}$, from the nineteenth cells $SC_{19}$ to the twenty-fifth cells $SC_{25}$, and so on every 96 clock periods. Therefore, the operation of the cells $SC_1$, $SC_7$, $SC_{13}$, and so on can be examined by monitoring the output data Dc of the logic circuit 60 every 96 clock periods.

Thus, with the arrangement of the memory 50, the procedures of test of the operation thereof can be significantly simplified in comparison with the memory 10 wherein writing of data and reading of data must be performed with respect to each of the selection lines. In the case where the logic circuit 60 is replaced with a circuit having a delay time equal to one clock period, data written into the first cells $SC_1$ is transferred in sequence from the first cells $SC_1$ to the second cells $SC_2$, from the second cells $SC_2$ to the third cells $SC_3$, from the third cells $SC_3$ to the fourth cells $SC_4$, from the fourth cells $SC_4$ to the fifth cells $SC_5$, and so on each time the data makes a round in the circuit. Therefore, only one time of writing of data is needed to test all the cells, whereby the test procedures are remarkably simplified.

In addition, each of the cells $SC_1$ to $SC_{45}$ comprises only three transistors, so that the power and space required can be substantially saved.

Although the above-described memory 50 comprises only two sets of storage sections RAM1 and RAM2 serially connected to each other, it will be evident that the number of sets of storage sections to be serially connected may be increased to augment the storage capacity with the refresh period being kept short. It will also be appreciated that the number of cells of each row should not necessarily be restricted to 45 and that the number may be set to a desired value within the range wherein the cells of each storage section can be properly refreshed. Furthermore, the delay time of the logic circuit 60 may be set to a desired value within a certain range.

With the arrangement of the above-described memory 50, the number of bits of one data which can be written into or read from the storage section by one access is 24. However, the memory 50 may be modified so that the number of bits of one data is greater than 24 and that another logic circuit having a function different from that of the logic circuit 60 is additionally provided. In this case, the sequential-access control circuits need not be additionally provided.

What is claimed is:

1. A sequential-access memory comprising:
   (a) a plurality of memory cell arrays arranged so that at least two memory cell arrays are adjoining, each memory cell array comprising a plurality of dynamic-type memory cells each having a write selection line, a read selection line, a data output line and a data input line, said plurality of memory cells being arranged to form at least one row of memory cells in such a manner that the read selection line of each memory cell is connected to the write selection line of the memory cell which comes next to said each memory cell to form an address selection line, the data output lines of said plurality of memory cells being connected together to form a read data line, said data input lines of said plurality of memory cells being connected together to form a write data line;
   (b) access control means for activating the address selection lines of each of said memory cell arrays one after another at a predetermined time interval; and
   (c) delay circuit means interposed between each adjoining pair of memory cell arrays among said memory cell arrays to connect said memory arrays in series in such a manner than data on said read data line of each memory cell array is delayed by a predetermined time interval and fed to said write data line of the memory cell array which comes next to said each memory cell array, the data on said read data line not being fed from said delay circuit means back to said each memory cell array.

2. A sequential-access memory comprising:
   (a) a plurality of memory cell arrays arranged so that at least two memory cell arrays are adjoining, each memory cell array comprising a plurality of dynamic-type memory cells each having a write selection line, a read selection line, a data output line and a data input line, said plurality of memory cells being arranged to form at least one row of memory cells in such a manner that the read selection line of each memory cell is connected to the write selection line of the memory cell which comes next to said each memory cell to form an address selection line, the data output lines of said plurality of memory cells being connected together to form a read data line, said data input ines of said plurality of memory cells being connected together to form a write data line;
   (b) access control means for activating the address selection lines of each of said memory cell arrays one after another at a predetermined time interval; and
   (c) delay circuit means interposed between each adjoining pair of memory cell arrays among said memory cell arrays to connect said memory arrays in series in such a manner than data on said read data line of each memory cell array is delayed by a predetermined time interval and fed to said write data line of the memory cell array which comes next to said each memory cell array;
   each of said memory cell arrays further comprising least one additional row of memory cells each identical in structure to said at least one row of memory cells, said address selection lines of said at least one row of memory cells being connected respectively to the corresponding address selection lines of said additional row of memory cells, said delay circuit means delaying data fed from said read data lines of each memory cell array by said predetermined time interval and feeding to said write data ines of the memory cell array which comes next to said each memory cell array.

3. A sequential-access memory according to claim 2, wherein one of said delay circuit means comprises a logic circuit for subjecting data inputted from the read data lines of the memory cell array connected to input side of said one delay circuit means to a predetermined operation and for outputting data representative of the result of said predetermine operation to the write data lines of the memory cell array connected to output side of said one delay circuit means in a delayed relation by a predetermined time period to said inputted data.

4. A sequential-access memory according to claim 3, wherein said predetermined operation effected by said logic circuit is an addition of said inputted data to data fed from an external circuit.

* * * * *